May 7, 1968 H. D. FISH 3,382,380

PULSE GENERATOR EMPLOYING UJT CIRCUIT CONTROLLED BY SCR

Filed June 28, 1966 2 Sheets-Sheet 1

INVENTOR.
HAROLD D. FISH

BY
Burns, Doane, Benedict, Irvecker, & Mathis
ATTORNEYS

INVENTOR.
HAROLD D. FISH
BY
Burns, Doane, Benedict, Swecker & Mathis
ATTORNEYS

United States Patent Office 3,382,380

Patented May 7, 1968

3,382,380

PULSE GENERATOR EMPLOYING UJT CIRCUIT CONTROLLED BY SCR

Harold D. Fish, Duncan, Okla., assignor to Halliburton Company, Duncan, Okla., a corporation of Delaware Continuation-in-part of application Ser. No. 496,359, Oct. 15, 1965. This application June 28, 1966, Ser. No. 561,122

8 Claims. (Cl. 307—268)

ABSTRACT OF THE DISCLOSURE

An electronic pulse, unijunction transistor, D.C. amplifier having a silicon controlled rectifier connected in series with a load across the base electrodes of the transistor, a resistor and capacitor being connected in parallel with the load and the emitter electrode of the transistor being connected at a point between the resistor and capacitor. The silicon controlled rectifier conducts in response to an input voltage pulse to reduce the voltage on one plate of the capacitor initiating a timing interval determined by the time required for the capacitor to charge through the resistor to a potential sufficiently high to fire the transistor.

This invention relates to a pulse amplifier and more particularly to a unijunction transistor circuit having an amplifying mode of operation controlled by a silicon controlled rectifier.

This application is a continuation-in-part of my copending application Ser. No. 496,359, filed Oct. 15, 1965, and now abandoned.

It is freqeuntly desired to amplify a voltage pulse in order to provide a pulse of sufficient amplitude and time duration to operate an electro-mechanical device. For instance, conventional flowmeters produce series of short voltage pulses which vary in frequency with the magnitude of the volume of fluid passing through the flowmeter. As these voltage pulses are of small magnitude and duration, without amplification they are frequently insufficient to actuate an electro-mechanical counter. Heretofore, pulse amplifiers which have been developed to increase the magnitude and duration of short voltage pulses have been complex and frequently have included a plurality of tubes or transistors as well as associated components. Because of their complexity, pulse amplifier circuits heretofore developed have often had unstable states of operation, and have been expensive and subject to failure.

Accordingly, a general object of the present invention is the provision of a solid state pulse amplifier which substantially eliminates the disadvantages of pulse amplifiers heretofore available.

It is another object of the invention to provide an electronic pulse amplifier which, in response to an input voltage pulse of small magnitude and time duration, provides an amplified output voltage pulse of a predetermined amplitude and time interval.

Yet another object of this invention is the provision of an electronic pulse amplifier which utilizes a unijunction transistor to provide stable and reliable operation.

The instant invention contemplates a solid state pulse amplifier which comprises a silicon controlled rectifier responsive to input pulses for causing a timing interval to occur in a unijunction transistor circuit. During this timing interval, an amplified output voltage pulse will be supplied across a load by the silicon controlled rectifier circuit. The instant invention thus comprises a compact yet very stable pulse amplifier circuit suitable for use in actuating electro-mechanical devices.

The invention and its many advantages will be further understood by reference to the following detailed description illustrated in the accompanying drawings, in which.

Figure 1:
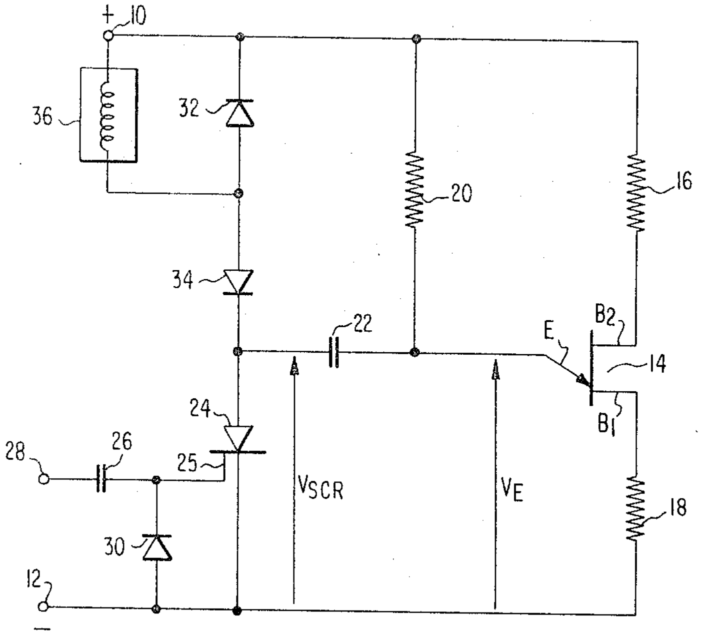
FIGURE 1 is a circuit diagram of an embodiment of the present invention.

Referring now to the drawings wherein like reference numbers refer to like parts throughout the several views, in FIGURE 1 the positive pole of a direct current voltage source may be applied to terminal 10, with the negative pole of the voltage source being applied to terminal 12. The direct current voltage may be of any magnitude suitable to provide a proper bias voltage to the unijunction transistor 14 through resistor 16. The unijunction transistor 14 may comprise a bar of semiconductor material such as N-type having spaced bilaterally conductive base contacts $B_1$ and $B_2$, with a P-type emitter junction E located somewhat above the center point of the bar of semiconductive material. Under quiescent conditions, the emitter E of the unijunction transistor is in a cutoff condition, with conductive current flow through the high resistivity bar of semiconductive material establishing a voltage drop from the emitter E to base $B_1$ which is proportional to the spacing on the bar between these points. The emitter E remains in a cutoff condition until the potential on the emitter E is increased to a point at which emitter E becomes more positive than the potential existing in the bar between the emitter E and base $B_1$. The emitter E then begins conduction, and minority carriers injected into the N-type bar travel through base $B_1$ and increase the charge density in the region of base $B_1$ to effectively decrease the voltage on the emitter E required for a given current flow through the emitter. Consequently, a negative input resistance may appear between the emitter E and base $B_1$.

Resistance 18 is placed in series with base $B_1$ to control to a large extent the slopes and intercepts of the saturation region of the unijunction transistor 14. The magnitude of resistance 16 primarily controls the magnitude of the negative input resistance when the transistor is in a conductive state. The emitter E of the unijunction transistor is connected to the positive terminal 10 through a charging resistor 20.

One terminal of a capacitor 20 is connected to the junction of emitter E and resistor 20. The remaining terminal of capacitor 22 is connected to the anode of a silicon controlled rectifier 24. The cathode of the silicon controlled rectifier 24 is connected to the negative terminal 12, while the gate electrode 25 of the rectifier 24 is connected through a coupling capacitor 26 to input terminal 28. The instant circuit is designed to be triggered by positive voltage pulses applied to the input terminal 28 from an input pulse source, such as a conventional flowmeter or other pulse generator, not shown. A diode 30 is connected between the gate electrode 25 and the negative terminal 12 in order to shunt negative voltage pulses from the input pulse source to eliminate false triggering. The capacitor 26 and the diode 30 thus provide sharp positive input pulses to the gate electrode 25 of the silicon controlled rectifier 24.

Connected between positive terminal 10 and the anode of the silicon controlled rectifier 24 are two unidirectionally conducting diodes 32 and 34. A load 36, which may be an inductance of the electro-mechanical type, is connected across diode 32 in order to receive an amplified output voltage in a manner to be subsequently described.

Figure 2:
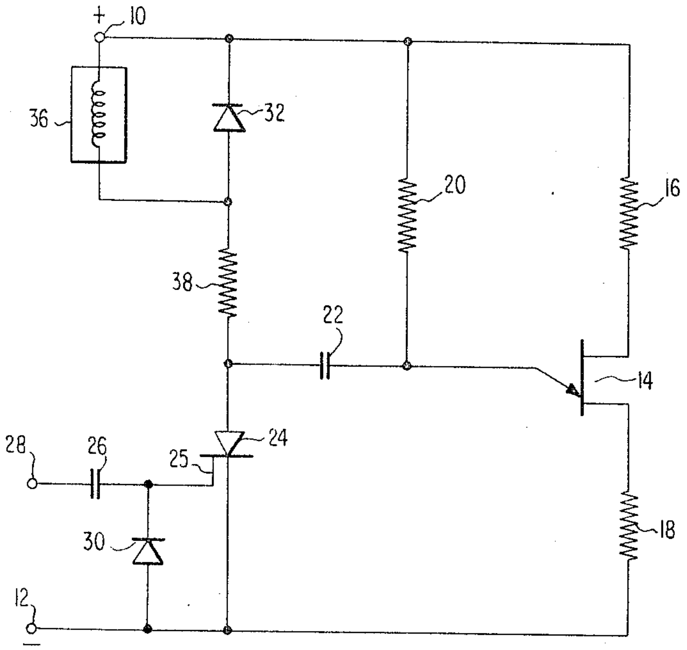
FIGURE 2 is a circuit diagram of another embodiment of the invention.

The circuit illustrated in FIGURE 2 is similar to the circuit previously described, except that a resistance 38 has been substituted for the diode 34. Resistance 38 has a relatively small magnitude sufficient to cause oscillation of the circuit in a manner to be subsequently described.

The operation of the circuit of FIGURE 1 upon initial energization by a direct current voltage source across terminals 10 and 12 will be explained with reference to the graphs shown in FIGURE 3. The silicon controlled rectifier 24 will normally be nonconductive and diode 34 will be conductive, thus presenting a relatively high voltage at the rectifier anode to the capacitor 22 as shown at voltage level 40 in FIGURE 3, graph (*a*). This voltage presented at the anode of the silicon controlled rectifier 24 will be less than the threshold voltage which is necessary for the unijunction transistor to become conductive. Because of the voltage drop across capacitor 22 due to the rectifier 24 leakage current, voltage does not normally build up on capacitor 22 sufficient to fire the transistor 14. The voltage $V_E$, shown in FIGURE 3, graph (*b*), normally applied to the emitter E of transistor 14 will not then be sufficient to cause the transistor to become conductive, or to fire. The circuit remains in this state until triggered by a suitable input pulse.

Figure 3:
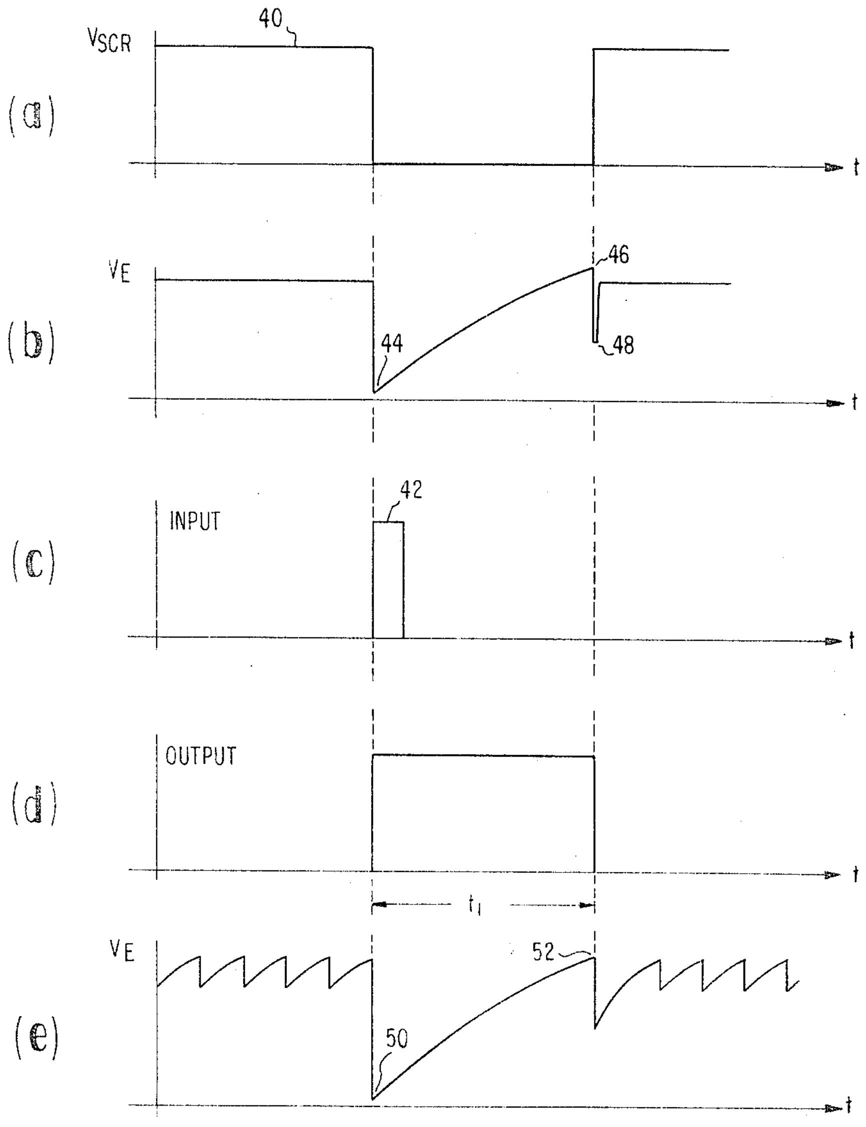
FIGURE 3 is a family of graphs of voltages at various points in the circuits.

Upon the occurrence of an input pulse 42, shown in FIGURE 3, graph (*c*), at the input terminal 28 and consequently at the gate electrode 25, the silicon controlled rectifier 24 will be triggered into a conductive state to provide a substantially shorted circuit between the capacitor 22 and the negative terminal 12. The voltage $V_E$ will thus be reduced substantially to zero, as shown at point 44 in FIGURE 3, graph (*b*). Transistor 14 remains cutoff, but capacitor 22 begins to charge up due to current flow through charging resistor 20. The timing interval $t_1$, shown in FIGURE 3, graph (*d*), is thus initiated. The timing interval is the period of time required for capacitor 22 to charge from substantially zero potential to the magnitude of voltage sufficient to cause the unijunction transistor to become conductive.

As shown in FIGURE 3, graphs (*c*) and (*d*), when the positive input pulse 42 causes the silicon controlled rectifier 24 to become conductive, an output voltage appears across the reversely biased diode 32 and across the load 36 for the duration of timing interval. This output voltage has a magnitude and duration sufficient to operate a relay or a similar device. Diode 32 suppresses any magnetic field across the load 36 to prevent turning off the silicon controlled rectifier. The stability of the instant pulse amplifier circuit results from the constant characteristics of the unijunction transistor 14 and from the fact that the silicon controlled rectifier 24 will remain conductive once triggered by a positive voltage pulse until caused to become nonconductive by a reverse current flow.

When the magnitude of the voltage across the capacitor 22 builds up to a voltage level 46, shown in FIGURE 3, graph (*b*), the unijunction transistor 14 fires. Voltage level 46 will have a slightly greater magnitude than the voltage normally applied across the transistor emitter. The capacitor 22 discharges through the emitter E and resistance 18, dropping $V_E$ to a voltage level 48, shown in FIGURE 3, graph (*b*). This causes a reverse flow of current through the silicon controlled rectifier 24 which causes the rectifier 24 to become nonconductive and which ends the timing interval. $V_E$ will then quickly rise to the normal level, where it remains until the circuit is again triggered by an input pulse. Diode 34 prevents reverse current flow through the load 36. It will be understood that the output pulse shown in FIGURE 3, graph (*d*) may be adjusted in both magnitude and time duration by variations of the direct current voltage applied across the terminals 10 and 12 and by suitable adjustments of charging resistor 20 and capacitor 22.

The operation of the circuit illustrated in FIGURE 2 is similar to the operation of the previously described circuit. As in the previous circuit, the silicon controlled rectifier 24 is normally nonconductive and thus presents a high voltage to the capacitor 22, shown at level 40 in FIGURE 3, graph (*a*). However, due to a small leakage current through rectifier 24, the capacitor 22 periodically charges up with sufficient voltage to cause periodic conduction of the unijunction transistor 14. When transistor 14 fires, the capacitor is discharged through the transistor and then begins to charge up again.

The present circuit thus normally acts as a relaxation oscillator, as shown in FIGURE 3, graph (*e*), with the frequency of oscillation determined by the magnitudes of resistor 20, capacitor 22, and the voltage magnitude presented at the anode of the nonconductive rectifier 24. Although transistor 14 periodically discharges, the amplitude of the voltage across the transistor emitter, shown in FIGURE 3, graph (*e*), drops only a relatively slight amount due to the large impedance presented by the rectifier 24 and due to the relative magnitudes of resistors 16 and 18. The amount of the voltage drop across the transistor 14 could of course be varied by changing component magnitudes.

Upon the occurrence of an input pulse 40, shown in FIGURE 3, graph (*c*), the silicon controlled rectifier becomes conductive and essentially shorts the capacitor 22 to circuit ground. An output pulse, shown in FIGURE 3, graph (*d*), appears across the load 36. The voltage across the transistor emitter drops substantially to zero at point 50, and then capacitor 22 begins to charge up to initiate the timing period.

The timing period is terminated when capacitor 22 charges up to a voltage level 52 which is sufficient to cause the transistor 14 to again fire. Capacitor 22 is discharged through transistor 14 and the silicon controlled rectifier 24 is turned off. The voltage across the transistor emitter then quickly builds up to again initiate periodic oscillation of the circuit. The circuit continues to oscillate until again triggered by a suitable input pulse, at which time another timing interval will occur.

The circuitry of the present invention may be conventionally packaged to form a very small, durable amplifier capable of providing amplified pulses of sufficient time duration and amplitude to energize electro-mechanical pulse counters. Although it will be apparent that the magnitude of the components may be substantially varied for different applications of the present circuit, the following is a tabular listing of values for components of the embodiment shown in FIGURE 1 which have been found to work well in practice:

| | |
|---|---|
| Unijunction transistor **14** | General Electric, type 2N2646. |
| Resistor **16** | 100 ohms. |
| Resistor **18** | 15 ohms. |
| Resistor **20** | 11K ohms. |
| Capacitor **22** | 1.5 microfarads. |
| Silicon controlled rectifier **24** | General Electric type C6U. |
| Capacitor **26** | 270 picofarads. |
| Diode **30** | General Instrument, type 1N191. |
| Diodes **32** and **34** | Radio Corporation of America, type 1N3254. |

While preferred embodiments have been described for the invention, the invention need not be limited to the exact apparatus illustrated and it should be understood that modifications which do not depart from the essence of the invention are obvious to those skilled in the art.

What is claimed is:

1. An electronic pulse amplifier comprising:

a unijunction transistor, said transistor having an emitter electrode and two base electrodes, first and second terminal means for delivering a direct current biasing voltage, each of said base electrodes being connected to one of said terminal means, resistive means connected between said first terminal means and said emitter electrode of said transistor, capacitor means having one terminal connected to said emitter electrode of said transistor and to said resistive means, rectifier means connected between said capacitor means and said second terminal means, said rectifier means being normally non-conductive to present a high impedance to said capacitor means, and circuit means responsive to an input pulse for causing said rectifier means to present a low impedance to said capacitor means for a timing interval dependent upon the charging of said capacitor means through said resistive means to a voltage sufficient to fire said unijunction transistor.

2. The apparatus of claim 1 comprising impedance means connected to said first terminal means in series with said rectifier means, an output voltage pulse appearing on said impedance means only during said timing interval.

3. The apparatus of claim 1 wherein said rectifier means comprises a silicon controlled rectifier.

4. The apparatus of claim 2 wherein said impedance means comprises two diodes having like polarity electrodes connected, one of said diodes providing a high impedance for providing an output voltage pulse only during the timing interval when said rectifier means is in a conductive state, the second of said diodes normally preventing said capacitor means from charging up to a voltage sufficient to fire said transistor.

5. The apparatus of claim 2 wherein said impedance means comprises resistor means of a magnitude sufficient to cause normal periodic oscillation of said pulse amplifier, said oscillation being interrupted during said timing interval.

6. An electronic pulse amplifier comprising a unijunction transistor having an emitter electrode and first and second base electrodes, first and second voltage supply terminal means for delivering direct current voltage, a first impedance means for biasing said transistor connected between said first terminal means and said second base electrode, a second impedance means connected between said emitter electrode and said first terminal means, a third impedance means connected between said first base electrode and said second terminal means, a capacitor and a normally nonconducting silicon controlled rectifier connected in series between said emitter electrode and said second terminal means, said rectifier having an anode connected to said capacitor and further having a gate electrode for receiving an input voltage, a pair of unidirectionally conducting means with like polarity electrodes common and connected in series between said first terminal means and said anode of said rectifier, said rectifier being responsive to an input voltage supplied to said gate electrode for becoming conductive and providing an amplified voltage pulse of a predetermined duration across one of said pair of unidirectionally conducting means, said conductive rectifier enabling said capacitor to charge up through said second impedance means during said predetermined duration to a voltage sufficient to fire said unijunction transistor and cause said rectifier to become nonconductive.

7. The apparatus of claim 4 wherein said rectifier means comprises a silicon controlled rectifier.

8. The apparatus of claim 5 wherein said rectifier means comprises a silicon controlled rectifier.

References Cited

UNITED STATES PATENTS

| | | | |
|---|---|---|---|
| 2,968,770 | 1/1961 | Sylvan | 307—88.5 XR |
| 3,189,844 | 6/1965 | MacKenzie | 307—88.5 XR |
| 3,210,686 | 10/1965 | Rocca | 307—88.5 XR |
| 3,309,536 | 3/1967 | Misthos | 307—88.5 |

ARTHUR GAUSS, *Primary Examiner.*

J. ZAZWORSKY, *Assistant Examiner.*